United States Patent
De Gasperi et al.

(10) Patent No.: US 11,443,990 B2
(45) Date of Patent: Sep. 13, 2022

(54) PROGNOSTIC HEALTH MANAGEMENT FOR POWER DEVICES

(71) Applicant: Infineon Technologies AG, Neubiberg (DE)

(72) Inventors: Sergio De Gasperi, Villach (AT); Michael Nelhiebel, Villach (AT); Alexander Mayer, Treffen (AT); Dieter Haerle, Villach (AT); Andrea Baschirotto, Tortona (IT)

(73) Assignee: Infineon Technologies AG, Neubiberg (DE)

( * ) Notice: Subject to any disclaimer, the term of this patent is extended or adjusted under 35 U.S.C. 154(b) by 157 days.

(21) Appl. No.: 16/915,794

(22) Filed: Jun. 29, 2020

(65) Prior Publication Data
US 2021/0407870 A1   Dec. 30, 2021

(51) Int. Cl.
H01L 21/66 (2006.01)
H01L 27/02 (2006.01)
G01R 31/26 (2020.01)

(52) U.S. Cl.
CPC .......... H01L 22/32 (2013.01); G01R 31/2607 (2013.01); H01L 27/0288 (2013.01); H01L 27/0292 (2013.01)

(58) Field of Classification Search
CPC . H01L 22/32; H01L 27/0288; H01L 27/0292; G01R 31/2607
See application file for complete search history.

(56) References Cited

U.S. PATENT DOCUMENTS

| | | | | |
|---|---|---|---|---|
| 5,796,789 A | * | 8/1998 | Eftechiou | H04M 3/205 379/7 |
| 7,980,138 B2 | * | 7/2011 | Ausserlechner | G01L 5/162 73/763 |
| 8,552,828 B1 | * | 10/2013 | Beer | H01L 23/49822 336/200 |
| 9,766,300 B2 | * | 9/2017 | Motz | G01R 33/077 |
| 10,250,029 B2 | * | 4/2019 | Carletti | H02H 3/20 |

FOREIGN PATENT DOCUMENTS

| | | | | |
|---|---|---|---|---|
| CN | 108594986 A | * | 9/2018 | G01S 17/08 |
| CN | 109301806 A | * | 2/2019 | H02H 9/02 |

OTHER PUBLICATIONS

Ritter et al., "Resistance change in on-chip aluminum interconnects under cyclic thermo-mechanical stress," Microelectronics Reliability, Elsevier, Jun. 7, 2019, 5 pp.
Ritter et al., "Aging sensors for on-chip metallization of integrated LDMOS transistors under cyclic thermo-mechanical stress," Microelectronics Reliability, Elsevier, accepted Jun. 6, 2017, 5 pp.
Jenkins et al., "On-chip circuit to monitor long-term NBTI and PBTI degradation," Microelectronics Reliability, Elsevier, accepted Jul. 10, 2013, 5 pp.

* cited by examiner

*Primary Examiner* — Christopher P McAndrew
*Assistant Examiner* — Zannatul Ferdous
(74) *Attorney, Agent, or Firm* — Shumaker & Sieffert, P.A.

(57) ABSTRACT

In some examples, a device includes a power structure and a sensing structure that is electrically isolated from the power structure. The device also includes processing circuitry configured to determine whether the sensing structure includes a prognostic health indicator, wherein the prognostic health indicator is indicative of a health of the power structure.

17 Claims, 7 Drawing Sheets

PROGNOSTIC HEALTH MANAGEMENT FOR POWER DEVICES

TECHNICAL FIELD

This disclosure relates to circuitry for semiconductor devices.

BACKGROUND

Power devices and semiconductor devices can be exposed to severe stress conditions. Such stress causes progressive aging and degradation, and eventually the stress can lead to device failure. The amount of stress applied to the switches in the field strongly varies from case to case. As a result, the actual operational lifetime of a power device may be unpredictable.

A power device can be designed to tolerate a worst-case mission profile during the lifetime of a system into which the power device will be installed (e.g., a vehicle). Only a small percentage of devices will be exposed to the worst-case mission profile. Consequently, for almost all of the application cases, power devices are overdesigned with respect to their actual mission profile.

SUMMARY

This disclosure describes techniques for a device including a power structure and a sensing structure that is electrically isolated from the power structure. The device also includes processing circuitry configured to determine whether the sensing structure includes a prognostic health indicator, wherein the prognostic health indicator is indicative of a health of the power structure. The processing circuitry may be able to predict a health issue in the power structure based on detection of the prognostic health indicator, before there is any evidence of the health issue in the power structure.

In some examples, a method includes measuring a current in a sensing structure that is electrically isolated from a power structure. The method also includes determining that the current in the sensing structure is greater than a threshold level. The method further includes setting a bit indicating a prognostic health issue in response to determining that the current in the sensing structure is greater than the threshold level.

In some examples, a system includes a power substrate comprising a power structure and a sensing structure, where the sensing structure is electrically isolated from the power structure. The system also includes a processing circuitry configured to control a driver to generate driver signals to control the power structure. The processing circuitry is further configured to measure a current in a sensing structure that is electrically isolated from a power structure. The processing circuitry is also configured to determine whether the current in the sensing structure is greater than a threshold level. The processing circuitry is further configured to set a bit indicating a prognostic health issue in response to determining that the current in the sensing structure is greater than the threshold level.

The details of one or more examples are set forth in the accompanying drawings and the description below. Other features, objects, and advantages will be apparent from the description and drawings, and from the claims.

DETAILED DESCRIPTION

This disclosure describes devices, methods, and techniques for predicting the health of a power structure using a sensing structure. Instead of directly sensing the health or status of the power structure, the sensing structure may include a prognostic health indicator that provides an indication of the health of the power structure. By implementing the sensing structure into a chip that also includes a power structure, or into a separate chip that is near the power structure, a device can provide health monitoring capabilities for prognostic health management.

For example, a sensing structure that directly senses the health of a power structure may not sense a degradation in the health of the power structure until the degradation becomes detectable (e.g., evident), which may be too late to alert a user, mitigate the degradation, and/or prevent a failure of the power structure. In contrast, a sensing structure of this disclosure may include an aging mechanism that can provide a prognostic health indication for the power structure by becoming evident before degradation of the power structure becomes evident. In this way, processing circuitry may be configured to predict degradation of the power structure based on an electrical parameter of the sensing structure before the degradation of the power structure becomes evident.

Fatigue affects the materials in a power structure and can eventually lead to aging and failure. Fatigue can also cause the sensing structure to exhibit an electrical signature, which may indicate a dangerous aging status of the power structure. The sensing structure may be configured to provide an electrical signature when the device is degraded to a state that could lead to a health issue for power structure. The electrical signature exhibited by the sensing structure may include a high or low current, a high or low voltage, a high or low impedance, a change in resistance, a change in impedance, a change in capacitance, an evolving short circuit, and/or an evolving open circuit in the dedicated sensing structure. One example signature is the breakdown in the oxide of an anti-fuse, which could eventually lead to a short circuit. Another example signature is the breakdown of a current path in a fuse-like structure, which could eventually lead to an open circuit. A device of this disclosure may include processing circuitry capable of providing warning signal in response to detecting the electrical signature before degradation occurs or becomes manifest in the power structure due to overstress or wear-out.

The sensing structure may include a dedicated, non-vital sensor, which is affected by thermomechanical fatigue. However, the sensing structure does not necessarily have the same failure mechanism as the power structure. The fatigue experienced by the sensing circuit can result in a characteristic electrical signature on the dedicated circuit, and this electrical signature can be read by a sensor in the dedicated circuit. In some examples, the time between the characteristic electrical signature and a health issue arising may be adjustable (e.g., through calibration) with respect to the aging dynamics of the power structure.

Figure 1:
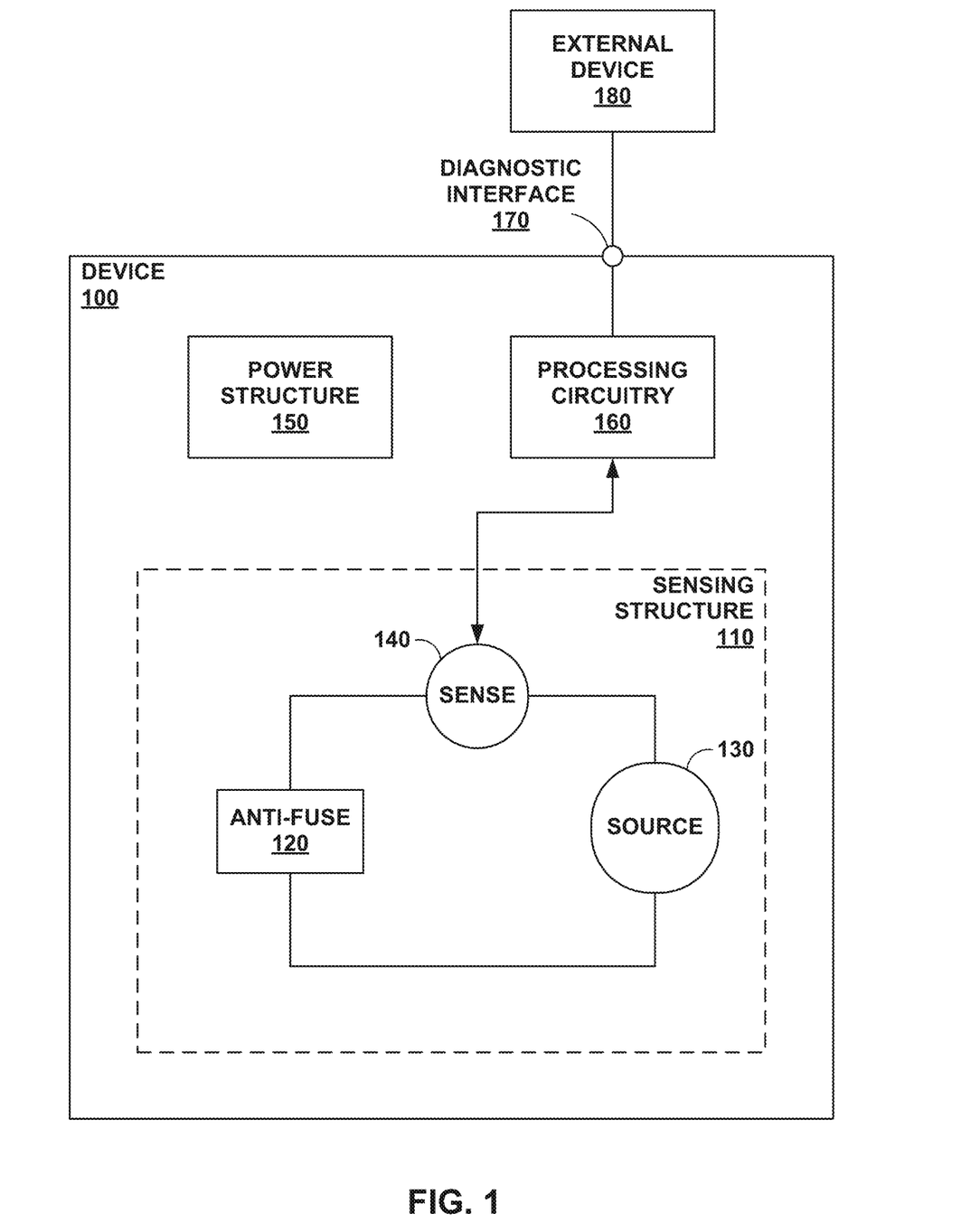
FIG. 1 is a conceptual block diagram of a device including a power structure and a sensing structure, in accordance with the techniques of this disclosure.

FIG. 1 is a conceptual block diagram of a device 100 including a power structure 150 and a sensing structure 110, in accordance with the techniques of this disclosure. In the example of FIG. 1, device 100 also includes processing circuitry 160 and optional diagnostic interface 170, although in some examples processing circuitry 160 may be located partially or fully outside of device 100.

Power structure 150 may include a power switch for regulating the delivery of electrical power to, or regulating the consumption of electrical power by, a load. Power structure 150 may include a load path for sourcing electrical power to, or sinking electrical power from, the load. Power structure 150 may also include an electrical conductor electrically connected to the load path to allow power structure 150 to sink or source electrical power. Power structure 150 may be part of a power electronics circuit and/or a power conversion circuit.

Power structure 150 may comprise, but is not limited to, any type of field-effect transistor (FET) such as a diffusion metal-oxide-semiconductor FET (MOSFET), a bipolar junction transistor (BJT), an insulated-gate bipolar transistor (IGBT), a high-electron-mobility transistor (HEMT), and/or another element that uses voltage for its control. Power structure 150 may include n-type transistors and/or p-type transistors. Power structure 150 may include semiconductor material such as silicon, silicon carbide, and/or gallium nitride.

Processing circuitry 160 is communicatively coupled to sensing structure 110. In some examples, processing circuitry 160 is also communicatively coupled to external device 180 via diagnostic interface 170. Processing circuitry 160 may include any suitable arrangement of hardware, software, firmware, or any combination thereof, to perform the techniques attributed to processing circuitry 160 herein. Examples of processing circuitry 160 include any one or more microprocessors, digital signal processors (DSPs), application specific integrated circuits (ASICs), field programmable gate arrays (FPGAs), or any other equivalent integrated or discrete logic circuitry, as well as any combinations of such components. When processing circuitry 160 includes software or firmware, processing circuitry 160 further includes any hardware for storing and executing the software or firmware, such as one or more processors or processing units.

In general, a processing unit may include one or more microprocessors, DSPs, ASICs, FPGAs, or any other equivalent integrated or discrete logic circuitry, as well as any combinations of such components. Although not shown in FIG. 1, processing circuitry 160 may include or be coupled to a memory configured to store data. The memory may include any volatile or non-volatile media, such as a random access memory (RAM), read only memory (ROM), non-volatile RAM (NVRAM), electrically erasable programmable ROM (EEPROM), flash memory, and the like. In some examples, the memory may be external to processing circuitry 160 (e.g., may be external to a package in which processing circuitry 160 is housed).

Diagnostic interface 170 is an optional component of device 100 that is configured to be communicatively coupled to external device 180. External device 180 may be configured to communicate with processing circuitry 160 via diagnostic interface 170. For example, processing circuitry 160 may be configured to transmit data related to sensing structure 110 to external device 180. In some examples, processing circuitry 160 may receive a command signal (e.g., one or more bits) from external device 180 and may be configured to take a measurement of sensing structure 110 in response to receiving the command signal. Additionally or alternatively, processing circuitry 160 may be configured to take a measurement at the time of manufacture and/or at predefined time intervals during operation of device 100.

In some examples, device 100 may include an onboard memory such as one-time programmable (OTP) memory for storing thresholds used in the testing of sensing structure 110. Processing circuitry 160 may be configured to store one or more thresholds to the onboard memory based on communication received from external device 180 via diagnostic interface 170. Processing circuitry 160 may be configured to perform a test of sensing structure 110 and send the test results to external device 180. As an example, testing may occur before device 100 is shipped to a customer. External device 180 may then analyze the results, determine new threshold(s), and communicate the new threshold level(s) to processing circuitry 160 for storage in the onboard memory. Processing circuitry 160 may be configured to then perform another test using the new threshold level(s).

In some examples, processing circuitry 160 and/or external device 180 may be configured to generate an alert to inform a user of a future health issue for power structure 150 in response to determining that sensing structure 110 includes the prognostic health indicator. Additionally or alternatively, processing circuitry 160 and/or external device 180 may be configured to shut off power structure 150 and/or operate power structure 150 at a lower power level in response to determining that sensing structure 110 includes the prognostic health indicator.

Power structure 150 may be built to operate for several years or decades. During the operating life of power structure 150, power structure 150 may go through thousands or millions of power cycles. For example, during each power cycle, a power switch of power structure 150 may be turned on and then turned off, resulting in temperature changes and in-rush currents for power structure 150. Power structure 150 will degrade over time due to the fatigue caused by a large number of power cycles.

In accordance with the techniques of this disclosure, sensing structure 110 is configured to include a prognostic health indicator that indicates the health of power structure 150. To measure the health of power structure 150, processing circuitry 160 may be configured to determine whether sensing structure 110 includes the prognostic health indicator. In some examples, the prognostic health indicator is a voltage or a current in sensing structure 110 that exceeds a threshold level. The prognostic health indicator may occur because of an aging mechanism of sensing structure 110. An example of an aging mechanism is the breakdown of an oxide in sensing structure 110.

Sensing structure 110 may have an aging mechanism that is different from an aging mechanism of power structure 150. Although the aging mechanisms may be different, the aging mechanisms may be designed to correlate over time such that the aging mechanism of sensing structure 110 (e.g., the prognostic health indicator) may become evident before the aging mechanism of power structure 150 becomes evident. Thus, by detecting that sensing structure 110 includes a prognostic health indicator, processing circuitry 160 can predict a health issue of power structure 150 before the health issue affects the performance of power structure 150. Sensing structure 110 may include the prognostic health indicator when the aging mechanism has progressed to the point where an electrical parameter of sensing structure 110 crosses a threshold level. Sensing structure 110 may be designed such that the aging mechanism of sensing structure 110 becomes evident before the aging mechanism of power structure 150 becomes detectable.

Unlike other sensors that are electrically connected to a power structure, sensing structure 110 is electrically isolated from power structure 150. In other words, each of structures 110 and 150 may receive power from a separate power source, where the power sources for structures 110 and 150 are electrically isolated. The power source for each of structures 110 and 150 may include a current source, a voltage source, a power rail, a battery, and/or a connection to mains power. The power source for sensing structure 110 may be a dedicated power source that is only used by sensing structure 110, or sensing structure 110 may be configured to share a power source with another element of device 100. Because of the electrical isolation between structures 110 and 150, the effects of thermomechanical fatigue on sensing structure 110 may not affect the operation of power structure 150.

However, in some examples, structures 110 and 150 may share a common power source. It is contemplated that device 100 may include a power source that supplies both sensing structure 110 and power structure 150, such that the power sources for sensing structure 110 is not separate from power structure 150. Even if structures 110 and 150 share a power source, structures 110 and 150 may still have different aging mechanisms. For example, by measuring the progression or status of the aging mechanism of sensing structure 110, processing circuitry 160 can predict a future health issue for power structure 150, with or without a common power source that is shared by structures 110 and 150.

Processing circuitry 160 may be configured to determine whether sensing structure 110 includes a prognostic health indicator by measuring a current in sensing structure 110. Additionally or alternatively, processing circuitry 160 may be configured to determine whether sensing structure 110 includes a prognostic health indicator by measuring a voltage, a resistance, a capacitance, and/or an impedance in sensing structure 110. Processing circuitry 160 may be configured to determine that sensing structure 110 includes the prognostic health indicator in response to determining that the current, voltage, resistance, capacitance, and/or impedance is greater than or is less than a threshold level.

The prognostic health indicator may be predictive of a health issue for power structure 150. The health issue may include a breakdown event for power structure 150 such as thermo-mechanical degradation of power structure 150. The degradation process for power structure 150 may be caused by thermomechanical fatigue. Over time, power structure 150 may degrade because of the stress caused by starting and stopping currents, fast changes in currents, fast turn-ons and turn-offs, and power dissipation caused by on-resistance. Degradation to power structure 150 may result in a short or open circuit between load terminals or may result in a short circuit between the control terminal and one or both of the load terminals.

In order to predict a health issue for power structure 150 before the health issue occurs, sensing structure 110 may provide a prognostic health indication. Sensing structure 110 can be designed such that a prognostic health indicator becomes evident before a health issue occurs in power structure 150. For example, a first, very early indicator may become evident in sensing structure 110 well in advance of a health issue in power structure 150. Other prognostic health indicators (e.g., associated with higher current levels) may become evident in sensing structure 110 after the first indicator but before a health issue occurs in power structure 150. Thus, sensing structure 110 can provide an early indication of future health issues for power structure 150.

After determining that sensing structure 110 includes a prognostic health indicator, processing circuitry 160 may be configured to output a signal to external device 180 via diagnostic interface 170, where the signal includes data about the prognostic health indicator(s). For example, the signal may include data about the type or severity of the prognostic health indicator(s), such as a very early indication, an early indication, or a late indication. The signal may also include data about the time at which the prognostic health indicator was detected by processing circuitry 160 and/or the number of occurrences of each prognostic health indicator.

Figure 2:
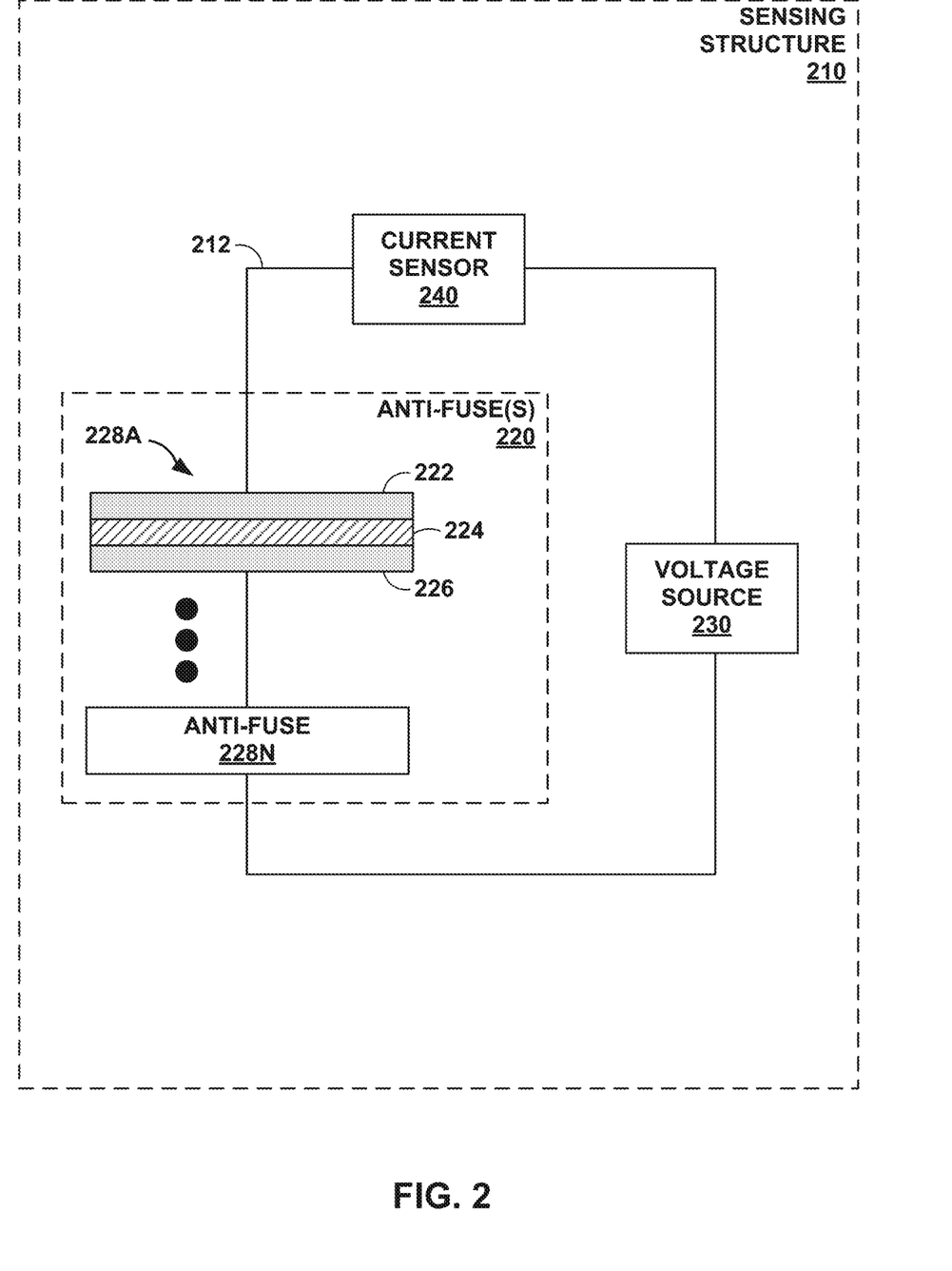
FIG. 2 is a conceptual block diagram of a sensing structure including one or more anti-fuses and a current sensor, in accordance with the techniques of this disclosure.
Figure 3:
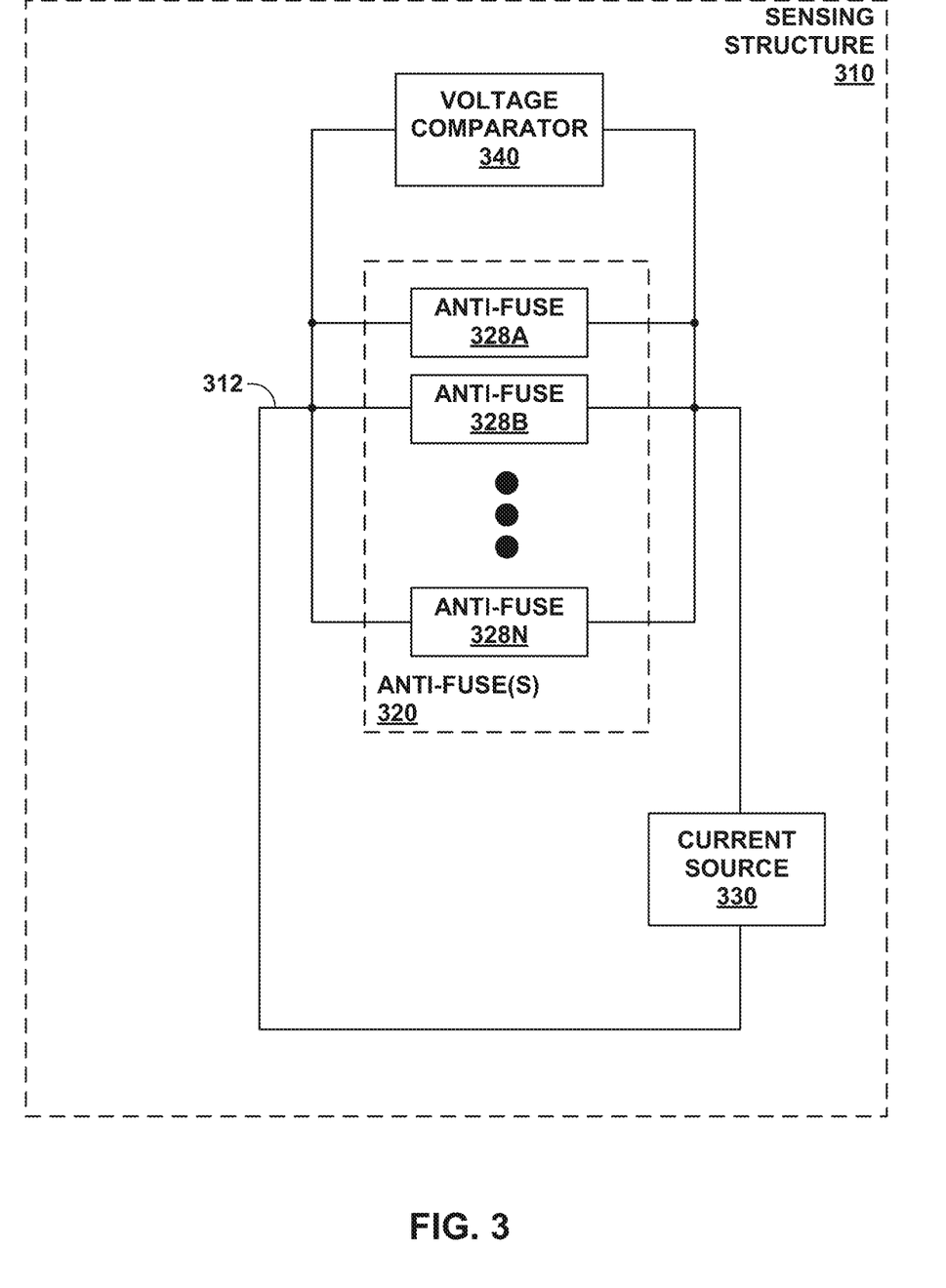
FIG. 3 is a conceptual block diagram of a sensing structure including one or more anti-fuses and a voltage comparator, in accordance with the techniques of this disclosure.

FIG. 2 is a conceptual block diagram of a sensing structure 210 including one or more anti-fuses 220 and a current sensor 240, in accordance with the techniques of this disclosure. Sensing structure 210 also includes electrical conductor 212, which connects voltage source 230 to anti-fuses 220. Although anti-fuse(s) 220 and 320 are shown in FIGS. 2 and 3 as examples of sensing structures 210 and 310, other components can be used to provide a prognostic health indicator. For example, a capacitor can provide a prognostic health indicator based on the breakdown of a dielectric barrier of the capacitor. As the dielectric barrier degrades, the capacitance and leakage current of the capacitor may change and provide an indication of a future health issue in a power structure.

Anti-fuses 220 may be used to monitor the health of a power structure. Each of anti-fuse(s) 228A-228N may include an electrical device with inverted electrical characteristics, as compared to a fuse. For example, a fuse starts with a low resistance and may be designed to permanently break an electrically conductive path when the current through that path exceeds a specified limit. Thus, a fuse degrades from low resistance to high resistance. In contrast, anti-fuses 220 may be configured to start with a relatively high resistance (e.g., on the order of gigaohms or megaohms) at the time of manufacture and degrade to lower resistance.

Programming anti-fuse(s) 220 can convert the high resistance of anti-fuse(s) 220 into a permanent electrically conductive path with a lower resistance on the order of tens, hundreds, or thousands of ohms. The programming of anti-fuse(s) 220 may include storing one or more threshold levels to an onboard memory to establish how quickly or slowly anti-fuse(s) 220 crosses a threshold level. The programming can include setting the thresholds for the prognostic health indicator(s) at the beginning of the chip's lifetime, such as at an automatic test equipment stage. The thresholds may be stored in OTP memory, flash, and/or any other type of memory. Although FIG. 2 depicts multiple anti-fuses 220, sensing structure 210 can also be implemented with a single anti-fuse. There may be any number of anti-fuses 220 in sensing structure 210, including one, two, three, or more anti-fuses. Anti-fuse(s) 220 may be connected in parallel and/or series.

As an example, anti-fuse 228A may include oxide 224 positioned between metal lines 222 and 226, where metal line 222 may be arranged in parallel with metal line 226. Oxide 224 may be configured to degrade and leak due to thermomechanical stress experienced by sensing structure 210, which may correlate to the thermomechanical stress experienced by a power structure. Thus, the leakage current through anti-fuse 228A may be configured to increase as oxide 224 of anti-fuse 228A degrades due to thermomechanical stress. In addition, the equivalent impedance of anti-fuse(s) 220 may decrease, and the voltage across anti-fuse(s) 220 may decrease, due to degradation caused by thermomechanical stress.

Current sensor 240 may be configured to sense a leakage current through anti-fuse(s) 220. The leakage current may be related to the voltage across anti-fuse(s) 220 and the impedance of anti-fuse(s) 220 through Ohm's Law. As the impedance of anti-fuse(s) 220 decreases due to thermomechanical stress, the leakage current through anti-fuse(s) 220 can increase if the voltage outputted by voltage source 230 remains stable. Because the anti-fuses 228A-228N are connected in series, the equivalent impedance of anti-fuses 228A-228N may be equal to the sum of the impedance of each of anti-fuses 228A-228N. For the voltage-source example shown in FIG. 2, anti-fuses 228A-228N may be connected in series, such that all of anti-fuses 228A-228N conduct the same electrical current.

In some examples, voltage source 230 is separate from and electrically isolated from a power source for a power structure. In other examples, voltage source 230 may be configured to supply power to the power structure, or voltage source 230 may receive power from the power source of the power structure. Electrical conductor 212 connects voltage source 230 and anti-fuse(s) 220, and electrical conductor 212 may also be electrically isolated from the power structure. Voltage source 230 may be configured to output a relatively stable voltage of one, two, three, or five volts, in some examples.

Processing circuitry may be configured to receive a signal from current sensor 240, where the signal indicates the leakage current through anti-fuse(s) 220. The processing circuitry may be configured to determine whether sensing structure 210 includes a prognostic health indicator by determining whether the leakage current is greater than a threshold level. In response to determining that the leakage current exceeds the threshold level, the processing circuitry may be configured to set a warning bit. In some examples, the processing circuitry may be configured to apply multiple threshold levels to the leakage current, where each threshold level represents a different warning type (e.g., very early, early, etc.). Each threshold level may be based on the specifications and arrangement of the anti-fuse(s). An early detection threshold may correspond to a resistance of greater than one, two, five or ten percent of the original resistance, and a later detection threshold may correspond to a resistance of less than one percent of the original resistance.

The threshold levels and other parameters (e.g., the arrangement of anti-fuses 220) of sensing structure 210 may be adjustable through a calibration process. For example, the processing circuitry may be configured to determine the threshold levels based on a command from an external device. The calibration process may be used to correlate sensing structure 210 to the dominant failure mechanism (e.g., aging mechanism) of the power structure, such as thermo-mechanical degradation. A threshold level may be adjustable for detection well in advance of any health issues with a power structure, or the threshold level may be adjusted to be triggered closer in time to the occurrence of a health issue in the power structure. Thus, the time between the aging mechanism of sensing structure 210 becoming evident and the aging mechanism of a power structure becoming evident may be adjustable.

FIG. 3 is a conceptual block diagram of a sensing structure 310 including one or more anti-fuse(s) 320 and a voltage comparator 340, in accordance with the techniques of this disclosure. Sensing structure 310 also includes electrical conductor 312, which connects current source 330 to anti-fuse(s) 320 and voltage comparator 340.

Current source 330 is configured to drive a current through anti-fuse(s) 320, which are connected in parallel. Processing circuitry may be configured to determine the voltage drop across anti-fuse(s) 320 based on the output of voltage comparator 340. In some examples, voltage comparator 340 may include one or more comparators configured to apply one or more threshold levels. In examples in which anti-fuse(s) 320 have a relatively high impedance (e.g., at the time of manufacture), the voltage drop across anti-fuse(s) 320 may be approximately the same as the supply voltage generated by current source 330. In examples in which the impedance of anti-fuse(s) 320 has decreased, the voltage drop may be closer zero volts.

The leakage current through anti-fuse(s) 320 may be configured to increase as the oxide(s) of anti-fuse(s) 320 degrades due to thermomechanical stress. In addition, the equivalent impedance of anti-fuse(s) 320 may decrease, and the voltage across anti-fuse(s) 320 may decrease, due to degradation caused by thermomechanical stress.

Processing circuitry may be configured to determine that sensing structure includes the prognostic health indicator by determining that the voltage across the anti-fuse is less than the voltage threshold level. The processing circuitry may be configured to apply more than one voltage threshold level, where the highest voltage threshold level may correspond to very early detection, and a lower voltage threshold level may correspond to early detection.

Figure 4:
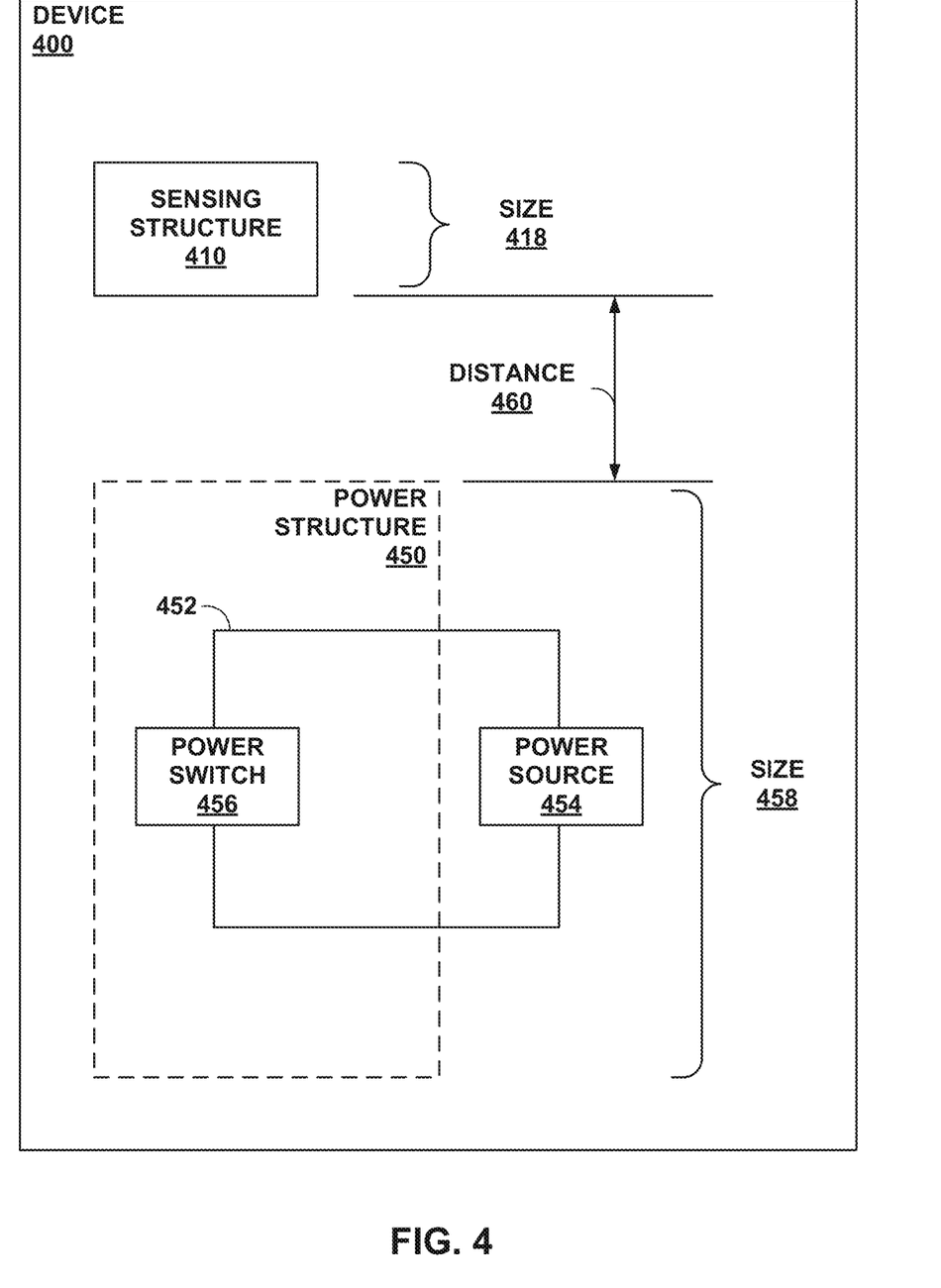
FIG. 4 is a conceptual block diagram of a sensing structure and a power structure including a power switch, in accordance with the techniques of this disclosure.

FIG. 4 is a conceptual block diagram of a sensing structure 410 and a power structure 450 including a power switch 456, in accordance with the techniques of this disclosure. In the example of FIG. 4, device 400 includes sensing structure 410, power structure 450, and power source 454. However, in other examples, power source 454 may be outside of device 400. For example, power source 454 may be stand-alone device and/or an external device.

In some examples, device 400 may include a single semiconductor substrate that includes sensing structure 410 and power structure 450. The single semiconductor substrate may be a single piece of semiconductor material, a single block of semiconductor material, and/or a single chip of semiconductor material. In other examples, sensing structure 410 may be off-chip such that structures 410 and 450 are arranged on separate semiconductor substrates.

Size 458 of power structure 450 may be larger than size 418 of sensing structure 410. For example, size 458 may be at least ten, one hundred, two hundred, one thousand, or two thousand times larger than size 418. Sizes 418 and 458 of structures 410 and 450 may refer to the chip area covered by structures 410 and 450 or the volume taken up by structures 410 and 450. Size 458 may include the size of power switch 456 and part or all of electrical conductor 452. In some examples, size 458 may include more than one power switch of power structure 450. Thus, sensing structure 410 can provide a prognostic health indicator for power structure 450 even though sensing structure 410 may be much smaller than power structure 450. By designing sensing structure 410 to be smaller than power structure 450, sensing structure 410 may not substantially increase the size of device 400.

In addition, the cross-sectional area of conductor 452 may be larger than a cross-sectional area of a conductor of sensing structure 410. For example, the cross-sectional area of conductor 452 may be at least ten, twenty, one hundred, or one thousand times larger than the cross-sectional area of a conductor of sensing structure 410. Conductor 452 may be connected to the load path of power switch 456 such that current can flow through conductor 452 when power switch 456 is activated.

Distance 460 between structures 410 and 450 may be small enough so that structures 410 and 450 experience correlated thermo-mechanical stress over a period of time. Structures 410 and 450 may experience thermo-mechanical stress caused by power cycles of power switch 456. Distance 460 may be less than one hundred, fifty, twenty, ten, five, or two power cell pitches of power switch 456, where power switch 456 includes a plurality of power cells and adjacent power cells are separated by a center-on-center power cell pitch (e.g., for trench devices). Distance 460 may be less than five hundred, one hundred, fifty, twenty, ten, five, or two micrometers. Distance 460 may be measured as the distance between the closest edges of structures 410 and 450. For example, distance 460 may be measured from the nearest edge of sensing structure 410 to the nearest edge of electrical conductor 452 or power switch 456.

Figure 5:
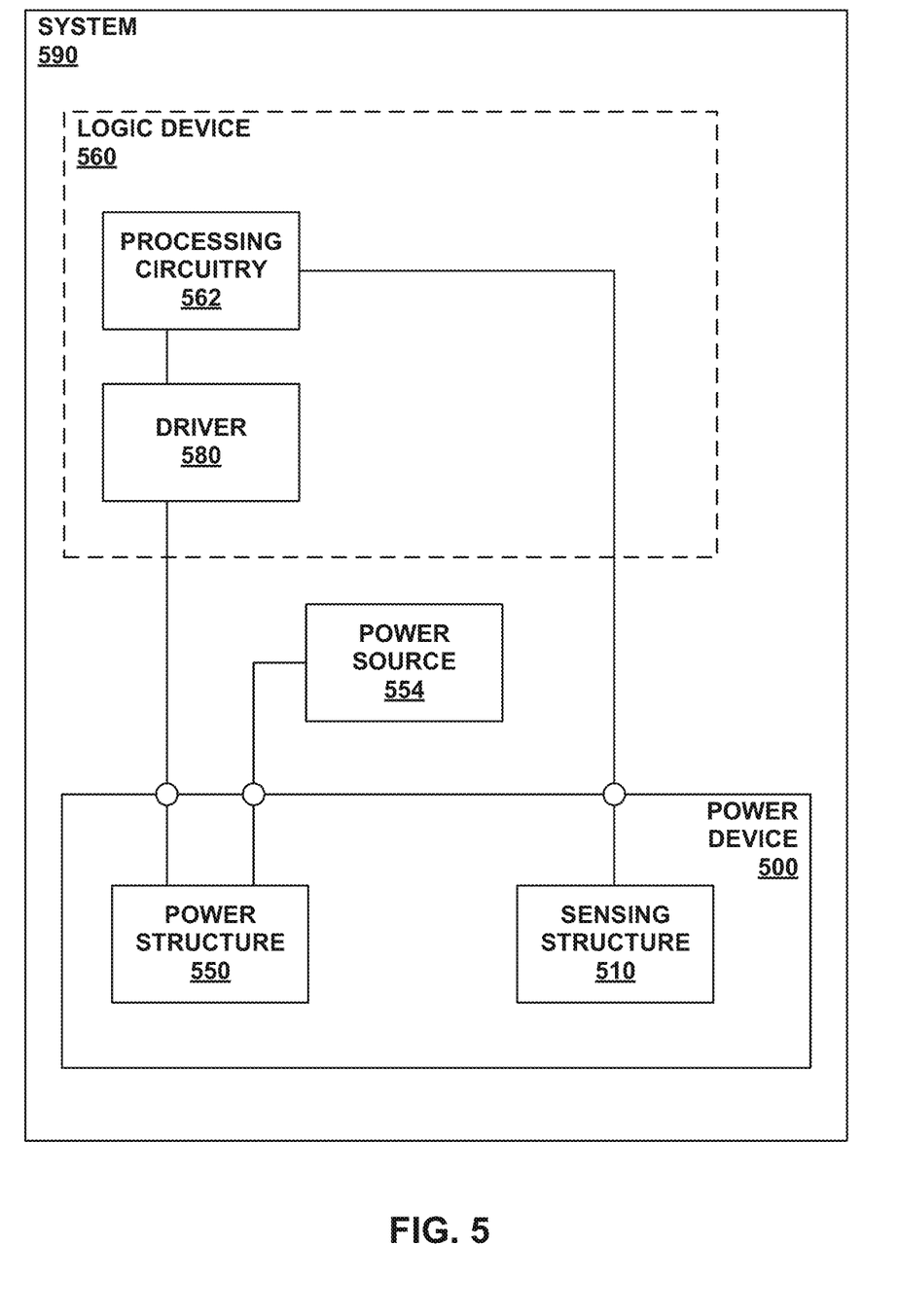
FIG. 5 is a conceptual block diagram of a system including a logic device and a power device, in accordance with the techniques of this disclosure.

FIG. 5 is a conceptual block diagram of a system 590 including a logic device 560 and a power device 500, in accordance with the techniques of this disclosure. In the example shown in FIG. 5, processing circuitry 562 is part of logic device 560, which also includes driver 580 for driving power structure 550. In some examples, processing circuitry 562 may control driver 580, while another processing element may be configured to determine whether sensing structure 510 includes a prognostic health indicator. In some examples, logic device 560 may comprise digital circuitry, and in other examples, logic device 560 may be partially or wholly made up of analog circuitry, as an alternative or in addition to digital circuitry.

In the example shown in FIG. 5, power source 554 for power structure 550 is outside of power device 500. In other examples, power source 554 may be integrated into power device 500, or power source 554 may be fully or partially external to system 590. Sensing structure 510 may include a power source that is separate from and electrically isolated from power source 554, or the power source for sensing structure 510 may be part of or connected to power source 554. The power source for sensing structure 510 may be integrated on power device 500 (e.g., inside of sensing structure 510), or the power source for sensing structure 510 may fully or partially outside of power device 500.

In the example shown in FIG. 5, driver 580 is part of logic device 560. In other examples, driver 580 may be separate from logic device 560. For example, driver 580 may be a stand-alone device, and/or driver 580 may be partially or fully integrated into device 560.

Figure 6:
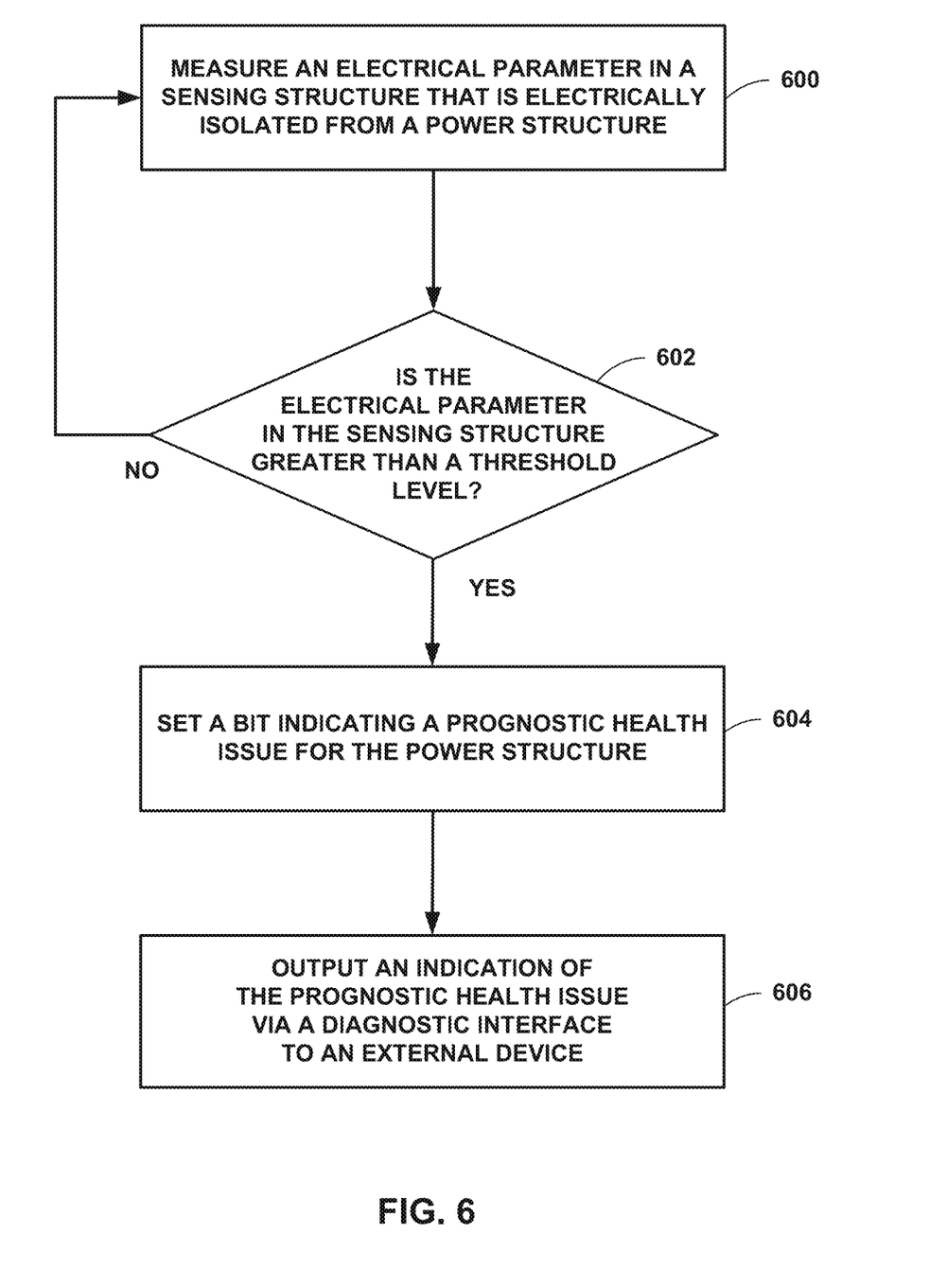
FIG. 6 is a flow diagram illustrating example techniques for detecting a prognostic health indicator in a power structure, in accordance with the techniques of this disclosure.

FIG. 6 is a flow diagram illustrating example techniques for detecting a prognostic health indicator in a power structure, in accordance with the techniques of this disclosure. The techniques of FIG. 6 are described with reference to the circuit shown in FIG. 1, although other components may exemplify similar techniques.

In the example of FIG. 6, processing circuitry 160 measures an electrical parameter in sensing structure 110 that is electrically isolated from power structure 150 (600). The electrical parameter may include voltage, current, impedance (e.g., resistance), a derivative of an electrical parameter, and/or any combination of electrical parameters. Processing circuitry 160 may be configured to receive a signal outputted by a sensor within sensing structure 110. Processing circuitry 160 may be configured to determine an amplitude or a value of the electrical parameter based on the signal received from sensing structure 110.

In the example of FIG. 6, processing circuitry 160 determines whether the electrical parameter in sensing structure 110 is greater than a threshold level (602). In some examples, processing circuitry 160 may be configured to compare the electrical parameter to multiple threshold levels. For example, processing circuitry 160 can compare the electrical parameter to a first threshold level representing very early detection of a health issue for power structure 150. The very early detection may occur well in advance of an actual performance issue for power structure 150. Processing circuitry 160 can compare the electrical parameter to a second threshold level representing early detection of the health issue for power structure 150. Processing circuitry 160 can compare the electrical parameter to a third threshold level representing late detection of a health issue for power structure 150. The late detection may occur before an actual performance issue for power structure 150, but processing circuitry 160 may be configured to output an alert in response to determining that the third threshold level has been exceeded. By using multiple threshold levels, processing circuitry 160 may be configured to pinpoint the life expectancy of power structure 150.

In the example of FIG. 6, processing circuitry 160 sets a bit indicating a prognostic health issue for power structure 150 (604). The bit may be stored in a memory on device 100, where the memory is coupled to processing circuitry 160. Processing circuitry 160 may be configured to set a first bit in response to determining that the electrical parameter is greater than a first threshold level, set a second bit in response to determining that the electrical parameter is greater than a second threshold level, and set a third bit in response to determining that the electrical parameter is greater than a third threshold level.

In some examples, processing circuitry 160 may be configured to set the bit only after several measurements exceed the threshold level in order to reduce the effect of noise on the determination. For example, in response to determining that the electrical parameter is greater than the threshold level, processing circuitry 160 may be configured to repeat the process by taking at least one additional measurement to confirm the determination. Processing circuitry 160 may be configured to set the bit in response to determining that N out of M measurements are greater than the threshold level, where N is an integer and M is an integer greater than or equal to N. As an example, processing circuitry 160 may set the bit in response to determining that at least three out of ten measurements are greater than the threshold level.

Additionally or alternatively, processing circuitry 160 may be configured to set the bit in response to that the electrical parameter is greater than the threshold level for more than a predetermined time duration. For example, processing circuitry 160 can determine that the electrical parameter exceeds the threshold level, set a timer, and then check whether the electrical parameter still exceeds the threshold level after the timer expires.

In the example of FIG. 6, processing circuitry 160 outputs an indication of the prognostic health issue via diagnostic interface 170 to external device 180 (606). The indication may include data about the prognostic health issue, such as the time of occurrence, the number of occurrences, and the severity or level of each occurrence.

Figure 7:
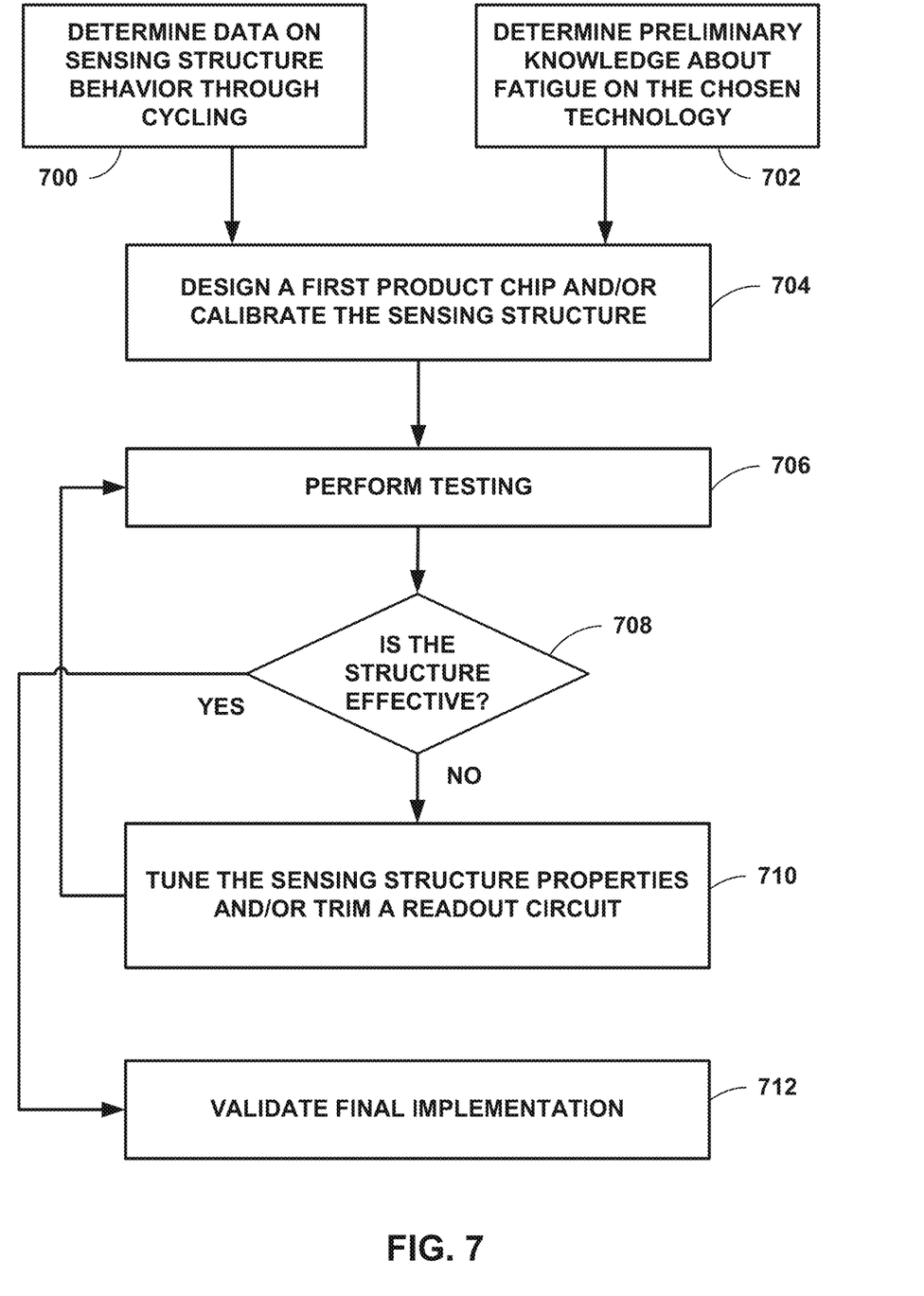
FIG. 7 is a flow diagram illustrating example techniques for designing a semiconductor device, in accordance with the techniques of this disclosure.

FIG. 7 is a flow diagram illustrating example techniques for designing a semiconductor device, in accordance with the techniques of this disclosure. In the example of FIG. 7, the designer determines data relating to a sensing structure behavior through cycling (700). The data may relate to the breakdown of an oxide of an anti-fuse (e.g., the impedance) across a number of power cycles. Additionally or alternatively, the data may relate to the current or voltage in the anti-fuse across the number of power cycles.

In the example of FIG. 7, the designer determines preliminary knowledge about fatigue on the chosen technology (702). The fatigue data may include the degradation of a power structure across a number of power cycles. The designer then designs a first product chip and/or calibrates the sensing structure (704). As one example, a designer can choose the thickness of the oxide based on the robustness of the power structure. Calibration of the sensing structure can include trimming the anti-fuses and/or adjusting the threshold levels applied by processing circuitry.

In the example of FIG. 7, the designer performs testing of the device (706). Testing may include determining when the sensing structure develops a prognostic health indicator and whether this development occurs before a health issue of the power structure becomes evident. The designer can then determine whether the sensing structure is effective (708). In examples in which the designer determines that the sensing structure is not effective, the designer tunes the properties of the sensing structure and/or trims a readout circuit based on the test results (710). The designer can tune the threshold levels and/or adjust the arrangement and connection of the anti-fuses. In the example of FIG. 7, the designer validates the final implementation (712). Once the design is validated, the design can be used to produce a batch of devices for distribution to customers.

This disclosure has attributed functionality to processing circuitry 160. Processing circuitry 160 may include one or more processors. Processing circuitry 160 may include any combination of integrated circuitry, discrete logic circuitry, analog circuitry, such as one or more microprocessors, digital signal processors (DSPs), application specific integrated circuits (ASICs), and/or field-programmable gate arrays (FPGAs). In some examples, processing circuitry 160 may include multiple components, such as any combination of one or more microprocessors, one or more DSPs, one or more ASICs, or one or more FPGAs, as well as other discrete or integrated logic circuitry, and/or analog circuitry.

The techniques described in this disclosure may also be embodied or encoded in an article of manufacture including a non-transitory computer-readable storage medium, such as a memory or storage unit associated with processing circuitry 160. In some examples, the memory may be local and electrically integrated with the processing circuitry, or in other examples, the memory may be external and electrically connected to processing circuitry 160, such as via a data bus or direct connection. Example non-transitory computer-readable storage media may include RAM, ROM, programmable ROM (PROM), erasable programmable ROM (EPROM), electronically erasable programmable ROM (EEPROM), flash memory, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

The following numbered examples demonstrate one or more aspects of the disclosure.

Example 1. A device for includes a power structure and a sensing structure that is electrically isolated from the power structure. The device also includes processing circuitry configured to determine whether the sensing structure includes a prognostic health indicator, wherein the prognostic health indicator is indicative of a health of the power structure.

Example 2. The device of example 1, where the power structure and the sensing structure are formed on a single semiconductor substrate.

Example 3. The device of example 1 or example 2, wherein a first aging mechanism of the power structure is different than a second aging mechanism of the sensing structure.

Example 4. The device of examples 1-3 or any combination thereof, wherein the processing circuitry is configured to determine whether the sensing structure includes the prognostic health indicator by measuring the second aging mechanism.

Example 5. The device of examples 1-4 or any combination thereof, wherein the first aging mechanism comprises thermo-mechanical degradation of the power structure.

Example 6. The device of examples 1-5 or any combination thereof, wherein the second aging mechanism comprises breakdown of an oxide in the sensing structure.

Example 7. The device of examples 1-6 or any combination thereof, wherein the sensing structure and the power structure experience correlated thermo-mechanical stress over a period of time.

Example 8. The device of examples 1-7 or any combination thereof, wherein the prognostic health indicator becomes evident before the thermo-mechanical degradation of the power structure becomes evident.

Example 9. The device of examples 1-8 or any combination thereof, wherein the power structure is supplied by a first power source, and wherein the sensing structure is supplied by a second power source electrically isolated from the first power source.

Example 10. The device of examples 1-9 or any combination thereof, wherein the sensing structure includes an anti-fuse.

Example 11. The device of examples 1-10 or any combination thereof, wherein the sensing structure includes a current sensor configured to sense a current flowing through the anti-fuse.

Example 12. The device of examples 1-11 or any combination thereof, wherein the processing circuitry is configured to determine that the sensing structure includes the prognostic health indicator by determining that the current flowing through the anti-fuse is greater than a threshold level.

Example 13. The device of examples 1-12 or any combination thereof, wherein the anti-fuse comprises an initial resistance of more than one hundred megaohms at a time of manufacture.

Example 14. The device of examples 1-13 or any combination thereof, wherein the threshold level corresponds to a resistance of less than one megaohm.

Example 15. The device of examples 1-14 or any combination thereof, further including a programmable memory configured to store the threshold level.

Example 16. The device of examples 1-15 or any combination thereof, further including a diagnostic interface configured to be communicatively coupled to an external device.

Example 17. The device of examples 1-16 or any combination thereof, wherein the processing circuitry is configured to store a new value for set the threshold level in the programmable memory based on communication received via the diagnostic interface from the external device.

Example 18. The device of examples 1-17 or any combination thereof, wherein the anti-fuse is a first anti-fuse, and the sensing structure further comprises a second anti-fuse connected in series with the first anti-fuse.

Example 19. The device of examples 1-18 or any combination thereof, wherein the current sensor is configured to sense the current through the first anti-fuse and through the second anti-fuse.

Example 20. The device of examples 1-19 or any combination thereof, wherein the sensing structure includes a current source configured to drive current through the anti-fuse.

Example 21. The device of examples 1-20 or any combination thereof, wherein the sensing structure includes a voltage comparator configured to compare a voltage across the anti-fuse to a voltage threshold level while the current source is driving the current through the anti-fuse.

Example 22. The device of examples 1-21 or any combination thereof, wherein the processing circuitry is configured to determine that the sensing structure includes the prognostic health indicator by determining that the voltage across the anti-fuse is less than the voltage threshold level.

Example 23. The device of examples 1-22 or any combination thereof, wherein the anti-fuse is a first anti-fuse, and the sensing structure further comprises a second anti-fuse connected in parallel with the first anti-fuse.

Example 24. The device of examples 1-23 or any combination thereof, wherein the current source is configured to drive current through the first anti-fuse and through the second anti-fuse.

Example 25. The device of examples 1-24 or any combination thereof, wherein the voltage comparator is configured to compare a voltage across the first anti-fuse and across the second anti-fuse to a voltage threshold level while the current source is driving the current through the first anti-fuse and through the second anti-fuse.

Example 26. The device of examples 1-25 or any combination thereof, wherein a size of the power structure is at least one hundred times greater than a size of the sensing structure.

Example 27. The device of examples 1-26 or any combination thereof, wherein a distance from the sensing structure to the power structure is less than ten times a pitch of a power cell in the power structure.

Example 28. The device of examples 1-27 or any combination thereof, wherein the power structure includes a power switch.

Example 29. The device of examples 1-28 or any combination thereof, wherein the power structure includes a first conductor electrically connected to a load path of the power switch.

Example 30. The device of examples 1-29 or any combination thereof, wherein the sensing structure includes an anti-fuse and a second conductor electrically connected to the anti-fuse.

Example 31. The device of examples 1-30 or any combination thereof, wherein a cross-sectional area of the first conductor is at least ten times larger than a cross-sectional area of the second conductor.

Example 32. A system includes a power substrate comprising the power structure and the sensing structure of examples 1-31 or any combination thereof.

Example 33. The system of example 32, wherein the processing circuitry is configured to control a driver to generate driver signals to control the power structure.

Example 34. The system of examples 32 or 33 or any combination thereof, wherein the processing circuitry is configured to measure a current in a sensing structure that is electrically isolated from a power structure.

Example 35. The system of examples 32-34 or any combination thereof, wherein the processing circuitry is configured to determine whether the current in the sensing structure is greater than a threshold level and to set a bit indicating a prognostic health issue in response to determining that the current in the sensing structure is greater than the threshold level.

Example 36. The system of examples 32-35 or any combination thereof, wherein the processing circuitry is configured to measure the current in the sensing structure comprises measuring a leakage current through the anti-fuse; and determine whether the current is greater than the threshold level comprises determining whether the leakage current is greater than the threshold level.

Example 37. A method includes measuring a current in a sensing structure that is electrically isolated from a power structure. The method also includes determining that the current in the sensing structure is greater than a threshold level. The method further includes setting a bit indicating a prognostic health issue in response to determining that the current in the sensing structure is greater than the threshold level.

Example 38. The method of example 37, further including any of the techniques performed by the processing circuitry of examples 1-31 or any combination thereof.

Example 39. A method includes a computer-readable medium having executable instructions stored thereon, configured to be executable by processing circuitry for causing the processing circuitry to perform the techniques of examples 1-31 or any combination thereof.

Example 40. A system includes means for performing the method of examples 1-31 or any combination thereof.

Various examples of the disclosure have been described. Any combination of the described systems, operations, or functions is contemplated. These and other examples are within the scope of the following claims.

What is claimed is:

1. A device comprising:
 a power structure, wherein the power structure defines a first aging mechanism that comprises thermo-mechanical degradation;
 a sensing structure electrically isolated from the power structure, wherein the sensing structure defines a second aging mechanism that is different than the first aging mechanism, wherein the second aging mechanism comprises breakdown of an oxide in the sensing structure; and
 processing circuitry configured to determine whether the sensing structure includes a prognostic health indicator by measuring the second aging mechanism, wherein the prognostic health indicator is indicative of a health of the power structure.

2. The device of claim 1, wherein the power structure and the sensing structure are formed on a single semiconductor substrate.

3. The device of claim 1,
wherein the sensing structure and the power structure experience correlated thermo-mechanical stress over a period of time, and
wherein the prognostic health indicator becomes evident before the thermo-mechanical degradation of the power structure becomes evident.

4. The device of claim 1,
wherein the power structure is supplied by a first power source, and
wherein the sensing structure is supplied by a second power source electrically isolated from the first power source.

5. The device of claim 1,
wherein the sensing structure further comprises:
an anti-fuse that includes the oxide; and
a current sensor configured to sense a current flowing through the anti-fuse, and
wherein the processing circuitry is configured to determine that the sensing structure includes the prognostic health indicator by determining that the current flowing through the anti-fuse is greater than a threshold level.

6. The device of claim 5,
wherein the anti-fuse comprises an initial resistance of more than one hundred megaohms at a time of manufacture, and
wherein the threshold level corresponds to a resistance of less than one megaohm.

7. The device of claim 5, further comprising:
programmable memory configured to store the threshold level; and
a diagnostic interface configured to be communicatively coupled to an external device,
wherein the processing circuitry is configured to store a new value for the threshold level in the programmable memory based on communication received via the diagnostic interface from the external device.

8. The device of claim 5,
wherein the anti-fuse is a first anti-fuse,
wherein the sensing structure further comprises a second anti-fuse connected in series with the first anti-fuse, and
wherein the current sensor is configured to sense the current through the first anti-fuse and through the second anti-fuse.

9. The device of claim 1,
wherein the sensing structure further comprises:
an anti-fuse that includes the oxide;
a current source configured to drive current through the anti-fuse; and
a voltage comparator configured to compare a voltage across the anti-fuse to a voltage threshold level while the current source is driving the current through the anti-fuse,
wherein the processing circuitry is configured to determine that the sensing structure includes the prognostic health indicator by determining that the voltage across the anti-fuse is less than the voltage threshold level.

10. The device of claim 9,
wherein the anti-fuse is a first anti-fuse,
wherein the sensing structure further comprises a second anti-fuse connected in parallel with the first anti-fuse,
wherein the current source is configured to drive current through the first anti-fuse and through the second anti-fuse, and
wherein the voltage comparator is configured to compare a voltage across the first anti-fuse and across the second anti-fuse to a voltage threshold level while the current source is driving the current through the first anti-fuse and through the second anti-fuse.

11. The device of claim 1, wherein a size of the power structure is at least one hundred times greater than a size of the sensing structure.

12. The device of claim 1, wherein a distance from the sensing structure to the power structure is less than ten times a pitch of a power cell in the power structure.

13. The device of claim 1,
wherein the power structure comprises:
a power switch; and
a first conductor electrically connected to a load path of the power switch,
wherein the sensing structure comprises:
an anti-fuse that includes the oxide; and
a second conductor electrically connected to the anti-fuse, and
wherein a cross-sectional area of the first conductor is at least ten times larger than a cross-sectional area of the second conductor.

14. A method comprising:
measuring a current in a sensing structure that is electrically isolated from a power structure wherein the sensing structure includes an oxide;
determining whether the sensing structure includes a prognostic health indicator by measuring a breakdown of the oxide, wherein the determining includes determining that the current in the sensing structure is greater than a threshold level; and
setting a bit indicating a prognostic health issue in response to determining that the current in the sensing structure is greater than the threshold level,
wherein the sensing structure and the power structure experience correlated thermo-mechanical stress over a period of time, and
wherein the breakdown of the oxide becomes evident before a thermo-mechanical degradation of the power structure becomes evident.

15. The method of claim 14,
wherein the sensing structure comprises an anti-fuse that includes the oxide,
wherein measuring the current in the sensing structure comprises measuring a leakage current through the anti-fuse, and
wherein determining whether the current is greater than the threshold level comprises determining whether the leakage current is greater than the threshold level.

16. A system comprising:
a power substrate comprising a power structure and a sensing structure, wherein the sensing structure is electrically isolated from the power structure;
processing circuitry configured to:
control a driver to generate driver signals to control the power structure;
measure a current in a sensing structure that is electrically isolated from a power structure;
determine whether the current in the sensing structure is greater than a threshold level; and
set a bit indicating a prognostic health issue in response to determining that the current in the sensing structure is greater than the threshold level,
wherein the sensing structure includes an oxide,
wherein the processing circuitry is configured to determine whether the sensing structure includes the prognostic health indicator by measuring a breakdown of the oxide, wherein the sensing structure and the power structure experience correlated thermo-mechanical stress over a period of time, and wherein the breakdown of the oxide becomes evident before a thermo-mechanical degradation of the power structure becomes evident.

17. The system of claim 16, wherein the sensing structure comprises an anti-fuse that includes the oxide, and wherein the processing circuitry is configured to:
- measure the current in the sensing structure by measuring a leakage current through the anti-fuse; and
- determine whether the current is greater than the threshold level by determining whether the leakage current is greater than the threshold level.

* * * * *